United States Patent
Li et al.

(10) Patent No.: US 10,340,919 B2
(45) Date of Patent: Jul. 2, 2019

(54) CIRCUIT FOR MONITORING TRANSIENT TIME IN ANALOG AND DIGITAL SYSTEMS

(71) Applicant: Taiwan Semiconductor Manufacturing Company Limited, Hsinchu (TW)

(72) Inventors: Shao-Yu Li, Hsinchu (TW); Shao-Te Wu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/203,559

(22) Filed: Nov. 28, 2018

(65) Prior Publication Data

US 2019/0165787 A1 May 30, 2019

Related U.S. Application Data

(60) Provisional application No. 62/592,005, filed on Nov. 29, 2017.

(51) Int. Cl.
| | |
|---|---|
| *H03K 19/173* | (2006.01) |
| *G01S 7/28* | (2006.01) |
| *H03K 21/10* | (2006.01) |
| *H03K 5/06* | (2006.01) |
| *H03K 5/00* | (2006.01) |

(52) U.S. Cl.
CPC ............ *H03K 19/1737* (2013.01); *G01S 7/28* (2013.01); *H03K 5/06* (2013.01); *H03K 21/10* (2013.01); *H03K 2005/0015* (2013.01)

(58) Field of Classification Search
CPC ...... H03K 19/1737; H03K 21/10; H03K 5/06; H03K 2005/0015; G01S 7/28
USPC .......................................................... 326/38
See application file for complete search history.

(56) References Cited

U.S. PATENT DOCUMENTS

| | | | | |
|---|---|---|---|---|
| 4,456,880 A * | 6/1984 | Warner | ............. | G01R 31/2603 136/290 |
| 4,686,628 A * | 8/1987 | Lee | .................... | G01R 31/2815 700/44 |
| 6,750,694 B1* | 6/2004 | Burns | ...................... | H03K 5/08 327/180 |
| 7,248,066 B2* | 7/2007 | Saraswat | ............ | G01R 31/2884 324/102 |
| 8,037,371 B1* | 10/2011 | Bikulcius | ......... | G01R 31/31709 375/224 |

(Continued)

*Primary Examiner* — Don P Le
(74) *Attorney, Agent, or Firm* — Jones Day

(57) ABSTRACT

Devices and methods are provided for monitoring a transient time in a device under test. A circuit includes a transient edge clipper circuit electrically coupled to the device under test. The transient edge clipper circuit is configured to remove voltage levels of a voltage waveform of the device under test which exceed a threshold range to generate a clipped voltage waveform. The circuit also includes logic circuitry electrically coupled to the transient edge clipper circuit. The logic circuitry is configured to generate a time delayed pulse signal representation of the clipped voltage waveform by injecting a predetermined time delay. The circuit also includes a converter circuit electrically coupled to the logic circuitry. The converter circuit is configured to generate a current signal based on the pulse signal representations.

20 Claims, 10 Drawing Sheets

(56) References Cited

U.S. PATENT DOCUMENTS

2010/0007354 A1* 1/2010 Deaver, Sr. .......... G01R 31/025
    324/539
2012/0303303 A1* 11/2012 Mittl ....................... G06F 19/00
    702/65

* cited by examiner

CIRCUIT FOR MONITORING TRANSIENT TIME IN ANALOG AND DIGITAL SYSTEMS

PRIORITY CLAIM

The present application claims priority to U.S. Application No. 62/592,005, filed Nov. 29, 2017, the content of which is incorporated by reference herein in its entirety.

FIELD

The technology described in this disclosure relates generally to electronic devices and more particularly to analog and digital systems.

BACKGROUND

In both digital and analog systems, a transient time characterizes electrical signal behavior of one or more electrical components. In digital systems, the transient time describes how long a signal spends in an intermediate state between two valid logic levels. In analog systems, the transient time specifies the time needed for the output to transition from one specified level to another and indicates the degree to which the system can achieve a fast transition. Under conventional approaches, the transient time is measured with an oscilloscope. In order to detect the signal of a device under test with a level of accuracy, an oscilloscope has a greater system bandwidth than the device under test. Oscilloscope accuracy can be adversely affected by capacitance load from a package, a printed circuit board (PCB), or a probe card of the oscilloscope.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
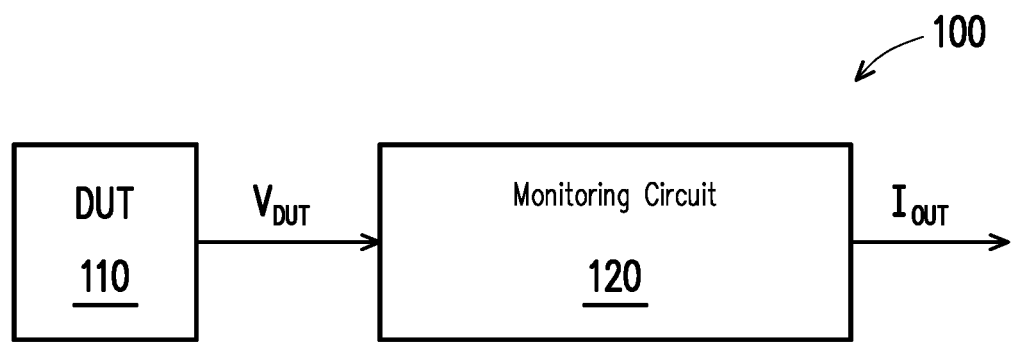
FIG. 1 depicts an example system having a DUT monitored by a monitoring circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A circuit, rather than an oscilloscope, can be used to monitor transient time in a device under test (DUT). FIG. 1 depicts a block diagram of a system 100 having a DUT 110 monitored by a monitoring circuit 120. Monitoring circuit 120 can monitor at voltage of the DUT 110, $V_{DUT}$, for transient time associated with the voltage which are outside of a predetermined threshold range. Monitoring circuit 120 outputs a voltage, $I_{OUT}$, that can be used to determine the transient time.

Figure 2A:
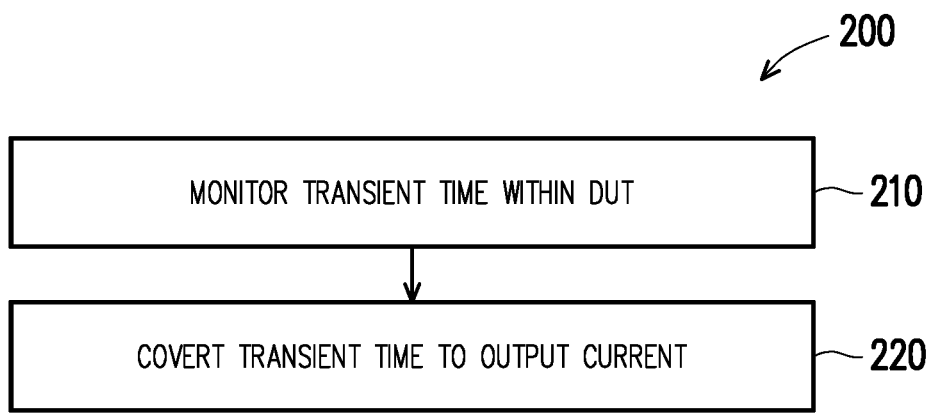
FIG. 2A depicts an example flow chart for monitoring transient time of an analog or digital device under test.

FIG. 2A depicts an example flow chart 200 for monitoring the transient time of an analog or digital device under test. The monitoring circuit 120 can monitor a transient time within the DUT at 210. Monitoring circuit 120 can convert that transient time to an output current, $I_{OUT}$, using a short pulse non-linearity technique. The short pulse non-linearity technique introduces a delay time into a measured voltage pulse in order to recover an ideal voltage pulse. With the ideal voltage pulse, an output current can be determined. An associated transient time can be determined from the output current. Use of the monitoring circuit 120 as described herein can provide real time monitoring of a DUT with adjustable thresholds for a particular DUT. The monitoring circuit 120 can provide a DC output current which is not restricted to any oscilloscope bandwidth limitations. Additionally, the monitoring circuit 120 can provide accurate transient time predictions within a picosecond of the actual transient time.

Figure 2B:
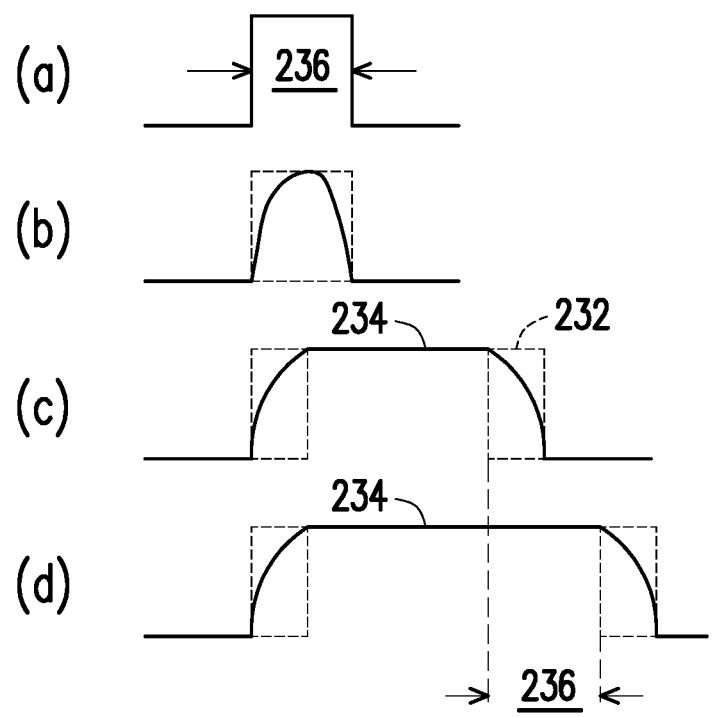
FIG. 2B depicts a series of plots (a)-(d) which illustrate an example short pulse non-linearity technique in accordance with some embodiments.

FIG. 2B depicts a series of plots (a)-(d) which illustrate an example short pulse non-linearity technique in accordance with some embodiments. The short pulse non-linearity technique is used in converting the transient time of DUT 110 to an output current, $I_{OUT}$, at 220. Plot (a) of FIG. 2B illustrates an ideal pulse 236 (e.g., voltage or current pulse) generated from a DUT 110. Due to various inefficiencies associated with electronics such as leakage currents, an actual pulse measured from a DUT 110 (e.g., at voltage point $V_{DUT}$) differs from an ideal pulse. This actual pulse is illustrated in plot (b) of FIG. 2B. In order to extract an ideal pulse 236 (e.g., plot (a) of FIG. 2B) from an actual pulse (e.g., plot (b) of FIG. 2B), a predetermined delay can be injected into the actual pulse of plot (b) in FIG. 2B as illustrated in plot (c) of FIG. 2B. In plot (c), the right most pulse component 232 is delayed or shifted right in a time domain by introducing a predetermined delay time 234. Converting the measured voltage at a voltage point, $V_{DUT}$, of DUT 110, using the electrical circuits described herein, results in a delayed actual pulse illustrated in plot (d) of FIG. 2B. The delayed actual pulse of FIG. 2B will include both the ideal pulse 236 of plot (a) and the delayed pulse 234 of plot (c). The predetermined time delay can be subtracted out of the delayed actual pulse of plot (d) to recover the ideal pulse 236 of plot (a).

As illustrated in plot (a) of FIG. 2B, an ideal pulse 236 includes a steady state level at its peak. In other words, the ideal pulse 236 forms a square wave. Actual pulses measured from a DUT 110 can also include spikes or peaks that exceed the peak of the ideal pulse 236 (not illustrated in plot (b) of FIG. 2B). These spikes or peaks can be caused by transient or non-linear voltages. In addition to extracting an ideal pulse in the time domain as described above in plots (c) and (d) of FIG. 2B, peaks of the measured voltage levels should be clipped when they exceed a predetermined threshold level such as a level that exceeds the ideal pulse peak.

Figure 3:
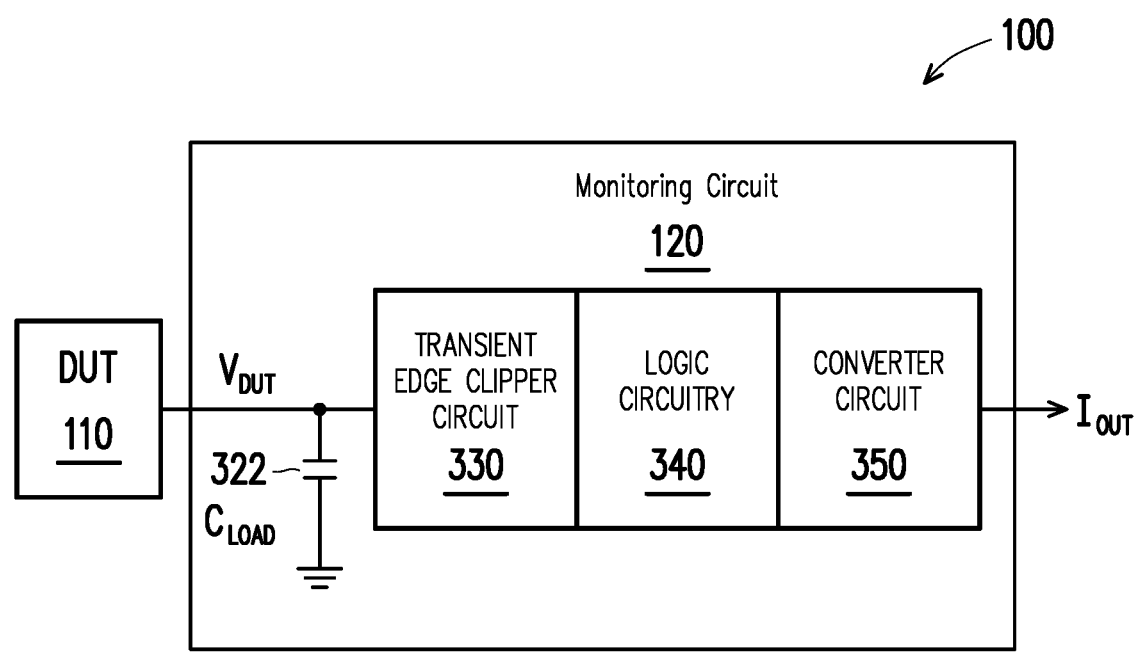
FIG. 3 depicts an example system for monitoring transient time of an analog or digital device under test using a monitoring circuit in accordance with some embodiments.

FIG. 3 depicts an example system 100 for monitoring the transient time of an analog or digital DUT 110 using a monitoring circuit 120 in accordance with some embodiments. Monitoring circuit 120 can include a load capacitor 322, a transient edge clipper circuit 330, logic circuit 340, and a converter circuit 350. A voltage point, $V_{DUT}$, of DUT 110 can be electrically coupled to monitoring circuit 120 for the monitoring of the transient time associated with the voltage point, $V_{DUT}$. The voltage point, $V_{DUT}$, can be, for example, a voltage point that may have been previously evaluated with an oscilloscope. Transient edge clipper circuit 330 can remove some voltage levels of a voltage waveform at voltage point, $V_{DUT}$, of the DUT 110. For example, some voltage levels may be transient or non-linear voltage levels. A threshold voltage range can be controlled and provided to transient edge clipper circuit 330 by load capacitor 322. As illustrated in FIG. 3, load capacitor 322, $C_{LOAD}$, can be electrically coupled between DUT 110 and transient edge clipper circuit 330. Transient edge clipper circuit 330 can generate a clipped voltage waveform by removing voltage levels of the voltage waveform at voltage point, $V_{DUT}$, which exceed the threshold voltage range, as described in detail below in FIG. 4. Load capacitor 322 can be selected in order to set a specified, predetermined threshold percentage level for clipping of the voltage waveform (e.g., 10%/90%, 20%/90%, 30%/70%). In other words, the swapping of various capacitances for load capacitor 322 can provide adjustable threshold capabilities to monitoring circuit 120. Monitoring circuit 120 can be tailored based on a desired voltage threshold range or based on characteristics of the DUT 110. Logic circuitry 340 generate pulse signal representations of the clipped voltage waveform received from the transient edge clipper circuit 330, as described in detail below in FIG. 4. A converter circuit 350 generates a current signal, $I_{OUT}$, based on the pulse signal representations.

Figure 4:
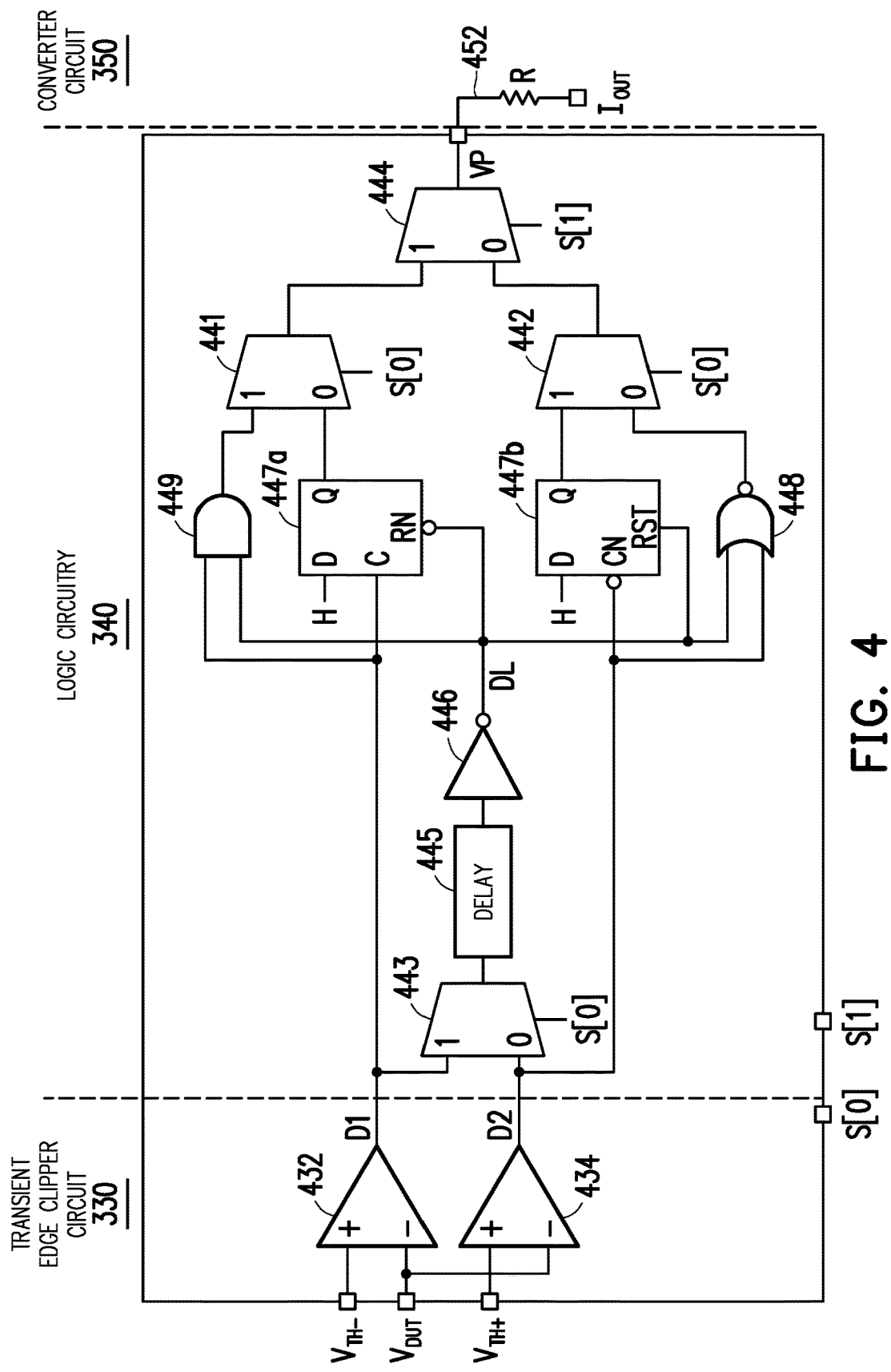
FIG. 4 depicts an example transient edge clipper circuit, logic circuitry, and converter circuit of the monitoring circuit of FIGS. 1 and 3 in accordance with some embodiments.

FIG. 4 depicts an example transient edge clipper circuit 330, logic circuitry 340, and converter circuit 350 of monitoring circuit 120 of FIG. 3 in accordance with some embodiments. Transient edge clipper circuit 330 can include operational amplifier 432 and operational amplifier 434. The inverting inputs to operational amplifiers 432, 434 and load capacitor 322 are electrically coupled together. A negative limit of the threshold voltage range, $V_{TH-}$, set by the voltage waveform at voltage point, $V_{DUT}$, is electrically coupled to the non-inverting input of operational amplifier 432. A positive limit of the threshold voltage range, $V_{TH+}$, set by the voltage waveform at voltage point, $V_{DUT}$, is electrically coupled to the non-inverting input of operational amplifier 434. The output voltage waveforms of operational amplifiers 432, 434 are clipped voltage waveforms that electrically coupled to logic circuitry 340.

Logic circuitry 340 includes multiplexers 441, 442, 443, 444, delay circuit 445, inverter 446, flip-flops 447a, 447b, negative OR (NOR) negative OR (NOR) gate 448, AND gate 449. In some embodiments, multiplexers 441, 442, 443, 444 are 2-to-1 multiplexers having a first input, '0' or 'A', a second input, '1' or 'B', a selector, 'S', and an output, 'D'. The multiplexers described herein can produce an output, 'Z', based on the following expression:

$$D=(A\cdot\overline{S})+(B\cdot S) \qquad (1)$$

The output of operational amplifier 432, D1, is provided to the second input '1' of multiplexer 443. The output of operational amplifier 434, D2, can be provided to the first input '0' of multiplexer 443. When the voltage waveform at voltage point, $V_{DUT}$, is approximately greater than a negative limit of the threshold voltage range, $V_{TH-}$, the output D1 of operational amplifier 432 is high or '1'. When the voltage waveform at voltage point, $V_{DUT}$, is approximately less than a negative limit of the threshold voltage range, $V_{TH-}$, the output D1 of operational amplifier 432 is low or '0'. Similarly, when the voltage waveform at voltage point, $V_{DUT}$, is approximately greater than a positive limit of the threshold voltage range, $V_{TH+}$, the output D2 of operational amplifier 434 is high or '1'. When the voltage waveform at voltage point, $V_{DUT}$, is approximately less than a positive limit of the threshold voltage range, $V_{TH+}$, the output D2 of operational amplifier 434 is low or '0'.

The output pulse of multiplexer 443 is delayed by time delay circuit 445. Time delay circuit 445 can inject a predetermined time delay into the pulse and generates a delayed pulse signal, DL. Such injection is known as a short pulse non-linearity technique. One can appreciate that an actual voltage waveform such as the measured voltage waveform of the DUT 110 at a voltage point, $V_{DUT}$, or a pulse signal representation generated therefrom, can include non-linearity such that the pulse signal is not an ideal, rectangular pulse signal. Introducing a predetermined time delay into the actual pulse generates a delayed pulse signal. The delayed pulse signal, DL, can extend the actual pulse signal in the time domain. In other words, the amount of time that the actual pulse remains at its peak is extended. The delayed pulse signal, DL, includes both the ideal pulse signal and the actual pulse signal. The ideal pulse signal can be recovered from the actual pulse signal by subtracting out the predetermined time delay. In order to facilitate this subtraction within logic circuitry 340, the delayed pulse signal, DL, is electrically coupled to an inverter 446. The output of inverter 446 is electrical coupled to an input of NOR gate 448, an input of AND gate 449, and a reset pin of flip-flop 447a, 447b. Output pulse signal 'D1' of operational amplifier 432 is electrically coupled to another input of AND gate 449. Output pulse signal 'D2' of operational amplifier 434 is electrically coupled to an input of NOR gate 448.

Figure 5:
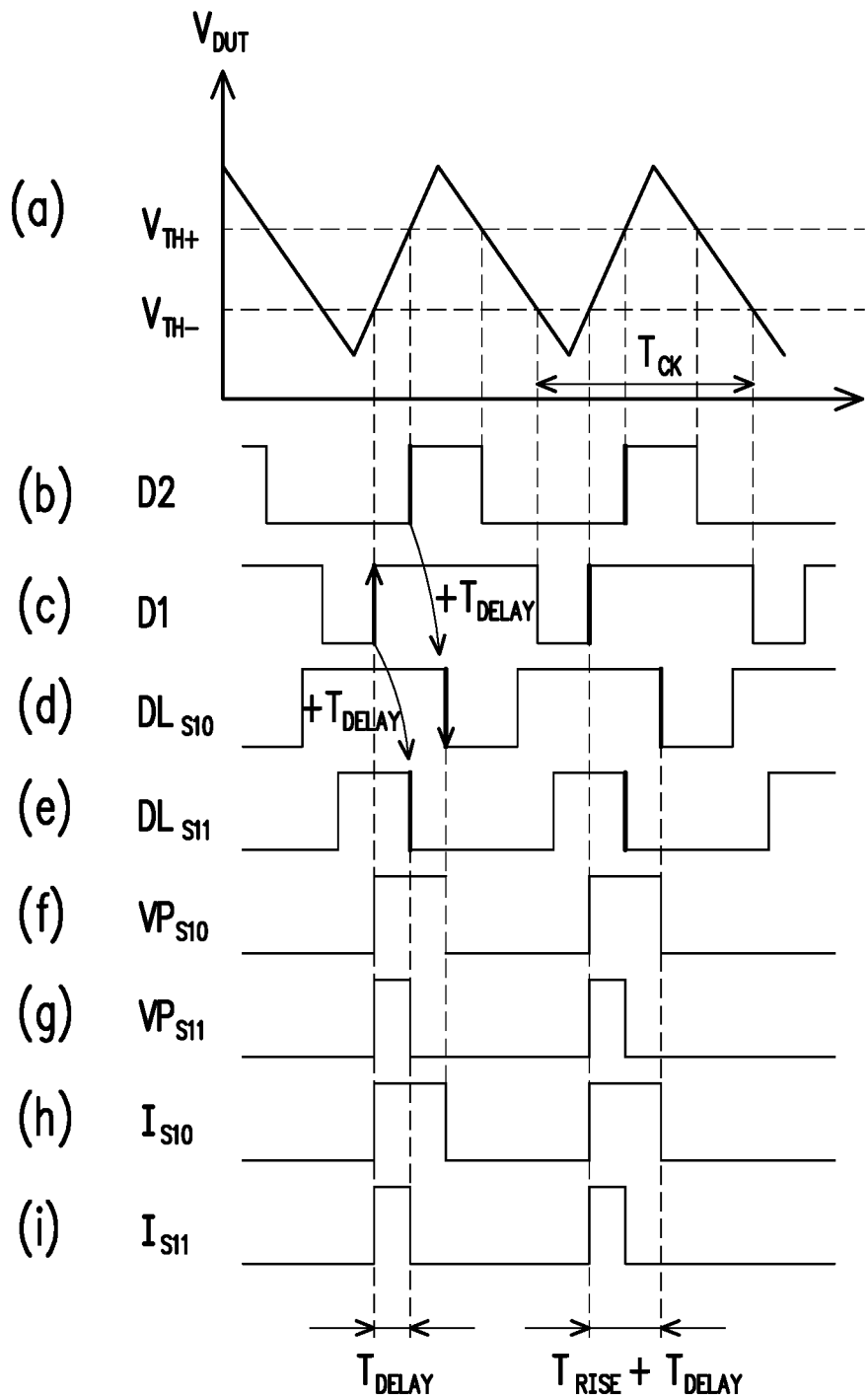
FIG. 5 depicts a series of plots (a)-(i) which illustrate an example detection of a rise time of FIGS. 1, 3, and 4 in accordance with some embodiments.

During rise time detection, NOR gate 448 is inactive and AND gate 449 is active, as described in more detail in FIG. 5. In other words, during rise time detection certain components of logic circuitry 340, such as NOR gate 448, flip-flop 447b, and multiplexer 442, are inactive and certain components of logic circuitry 340, such as AND gate 449, flip-flop 447a, and multiplexer 441 are active. The output of multiplexer 441 can be electrically coupled to an input of multiplexer 444.

Figure 6:
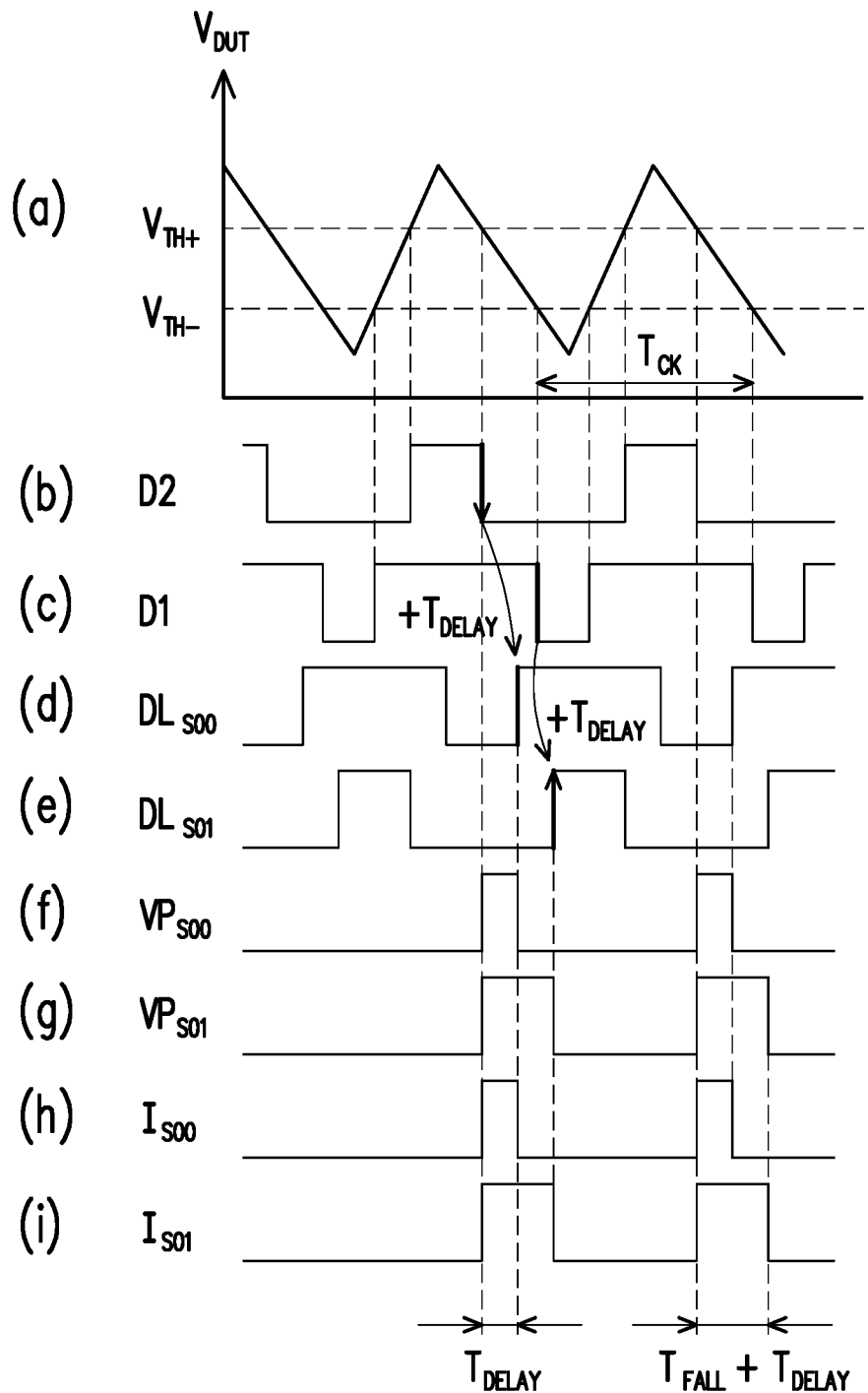
FIG. 6 depicts a series of plots (a)-(i) which illustrate an example detection of a fall time of FIGS. 1, 3, and 4 in accordance with some embodiments.

During fall time detection, AND gate 449 is inactive and NOR gate 448 is active, as described in detail in FIG. 6. In other words, during fall time detection certain components of logic circuitry 340 such as AND gate 449, flip-flop 447a, and multiplexer 441 are inactive and certain components of logic circuitry 340 such as flip-flop 447b, NOR gate 448, and multiplexer 442 can be active.

The outputs of multiplexer 441 and multiplexer 442 are electrically coupled to multiplexer 444. More specifically, the output of multiplexer 442 is electrically coupled to a first input '0' of multiplexer 444 and the multiplexer 441 is electrically coupled to a second input '1' of multiplexer 444. The output of multiplexer 444 produces a voltage pulse representation, VP. The voltage pulse representation, VP, is provided to converter circuit 350.

An output current pulse representation, $I_{OUT}$, can be generated by converter circuit 350. Converter circuit 350 can be a time-to-current converter and includes resistor 452, R. For a periodic current signal, the active time of the current signal traveling through resistor 452, R, can be captured by the average current through the resistor. The output current, $I_{OUT}$, of FIG. 1 is the average current traveling through resistor 452, R. The rise time, $T_{RISE}$, or fall time, $T_{FALL}$, can be determined using the following equation:

$$T_{RISE} \text{ or } T_{FALL} = \frac{(I_{OUT})T_{CK}}{I_{DC}} \tag{2}$$

where $T_{CK}$ is the cycle time duration of the voltage waveform of DUT 110 and $I_{DC}$ is the direct current (DC) at the DC input.

FIG. 5 depicts a series of plots (a)-(i) which illustrate an example detection of a rise time of FIGS. 1 and 3-4 in accordance with some embodiments. Plot (a) of FIG. 5 illustrates a voltage waveform of the DUT 110, $V_{DUT}$, with delineations for the threshold voltage range having a negative voltage threshold, $V_{TH-}$, and a positive voltage threshold, $V_{TH+}$, defined by load capacitor 322. Load capacitor 322 and transient edge clipper circuit 330 clips the voltage waveform of plot (a) to be within the bounds of the predetermined threshold voltage range. Plot (b) of FIG. 5 illustrates a pulse signal representation, 'D2', generated by operational amplifier 434. With the voltage waveform inputs of plot (a), the pulse signal representation 'D2' generated by operational amplifier 434 will be high '1' when the clipped voltage waveform is higher than the positive threshold voltage, $V_{TH+}$, and low when the clipped voltage waveform is any other voltage, as illustrated in plot (b). The pulse signal representation 'D1' generated by operational amplifier 432 will be high when the clipped voltage waveform is any voltage higher than the negative voltage threshold, $V_{TH-}$, as illustrated in plot (c). Plots (d) and (e) of FIG. 5 illustrate the delayed pulse signal representation components of Equation (1) generated by multiplexer 443 after being passed through time delay circuit 445 and inverter 446. The time domain logical representation of plot (d) is as follows:

$$TDL_{S10} = \overline{(T_{D2} + T_{DELAY})} \tag{3}$$

where $T_{D2}$ is the time domain representation of the pulse signal representation 'D2' of operational amplifier 434, $T_{DELAY}$, is a predetermined time delay introduced by time delay circuit 445, and $TDL_{S10}$ is the time domain representation of plot (d). The time domain logical representation of plot (e) is as follows:

$$TDL_{S11} = \overline{(T_{D1} + T_{DELAY})} \tag{4}$$

where $T_{D1}$ is the time domain representation of the pulse signal representation 'D1' of operational amplifier 432, $T_{DELAY}$, is a predetermined time delay introduced by time delay circuit 445, and $TDL_{S11}$ is the time delay representation of plot (e). Plots (f) and (g) of FIG. 5 are voltage pulse representations, VP, of the output of flip-flop 447a, $VP_{S10}$, and AND gate 449, $VP_{S11}$, respectively. Plots (h) and (i) of FIG. 5 are current pulse representations of $I_{OUT}$ generated by converter circuit 350. The current pulse representations output by multiplexer 444 can be represented by the following logic expressions:

$$I_{S11} = \frac{VP_{S11}}{R} \tag{5}$$

$$I_{S10} = \frac{VP_{S10}}{R} \tag{6}$$

where $VP_{S11}$ is the voltage representation of the output of AND gate 449, $VP_{S10}$ is the voltage representation of the output of flip-flop 447a, and R is resistor 452. As illustrated in plot (i) of FIG. 5, a rise time, $T_{RISE}$, of DUT 100 can be determined by the difference between pulse width of the pulse signal representation of plot (h) and the predetermined time delay introduced by time delay circuit 445. In accordance with the embodiments of FIG. 5, the rise time of Equation (2) can be represented by the following expression:

$$T_{RISE} = \frac{(I_{S10} - I_{S11})T_{CK}}{I_{DC}} \tag{7}$$

FIG. 6 depicts a series of plots (a)-(i) which illustrate an example detection of a fall time of FIGS. 1, and 3-4 in accordance with some embodiments. Plot (a) of FIG. 6 illustrates a voltage waveform of the DUT 110, $V_{DUT}$, with delineations for the threshold voltage range having a negative voltage threshold, $V_{TH-}$, and a positive voltage threshold, $V_{TH+}$, defined by load capacitor 322. Load capacitor 322 and transient edge clipper circuit 330 clips the voltage waveform of plot (a) to be within the bounds of the predetermined threshold voltage range. Plot (b) of FIG. 6 illustrates a pulse signal representation, 'D2', generated by operational amplifier 434. With the voltage waveform inputs of plot (a), the pulse signal representation 'D2' generated by operational amplifier 434 will be high '1' when the clipped voltage waveform is higher than the positive threshold voltage, $V_{TH+}$, and low when the clipped voltage waveform is any other voltage, as illustrated in plot (b). The pulse signal representation 'D1' generated by operational amplifier 432 will be high when the clipped voltage waveform is any voltage higher than the negative voltage threshold, $V_{TH-}$, as illustrated in plot (c). Plots (d) and (e) of FIG. 6 illustrate the delayed pulse signal representation components of Equation (1) generated by multiplexer 443 after being passed through time delay circuit 445 and inverter 446. The time domain logical representation of plot (d) is as follows:

$$TDL_{S00} = \overline{(T_{D2} + T_{DELAY})} \quad (8)$$

where $T_{D2}$ is the time domain representation of the pulse signal representation 'D2' of operational amplifier 434, $T_{DELAY}$, is a predetermined time delay introduced by time delay circuit 445, and $TDL_{S00}$ is the time domain representation of plot (d). The time domain logical representation of plot (e) is as follows:

$$TDL_{S01} = \overline{(T_{D1} + T_{DELAY})} \quad (9)$$

where $T_{D1}$ is the time domain representation of the pulse signal representation 'D1' of operational amplifier 432, $T_{DELAY}$, is a predetermined time delay introduced by time delay circuit 445, and $TDL_{S01}$ is the time delay representation of plot (e). Plots (f) and (g) of FIG. 6 are voltage pulse representations, VP, of the output of flip-flop 447b, $VP_{S01}$, and NOR gate 448, $VP_{S00}$. Plots (h) and (i) of FIG. 6 are current pulse representations of $I_{OUT}$ generated by converter circuit 350. The current pulse representations output by multiplexer 444 can be represented by the following logic expressions:

$$I_{S01} = \frac{VP_{S01}}{R} \quad (10)$$

$$I_{S00} = \frac{VP_{S00}}{R} \quad (11)$$

where $VP_{S01}$ is the voltage representation of the output of flip-flop 447b, $VP_{S00}$ is the voltage representation of the output of NOR gate 448, and R is resistor 452. As illustrated in plot (i) of FIG. 6, a fall time, $T_{FALL}$, of DUT 100 can be determined by the difference between pulse width of the pulse signal representation of plot (i) and the predetermined time delay introduced by time delay circuit 445. In accordance with the embodiments of FIG. 6, the fall time of Equation (2) can be represented by the following expression:

$$T_{FALL} = \frac{(I_{S01} - I_{S00})T_{CK}}{I_{DC}} \quad (12)$$

Figure 7:
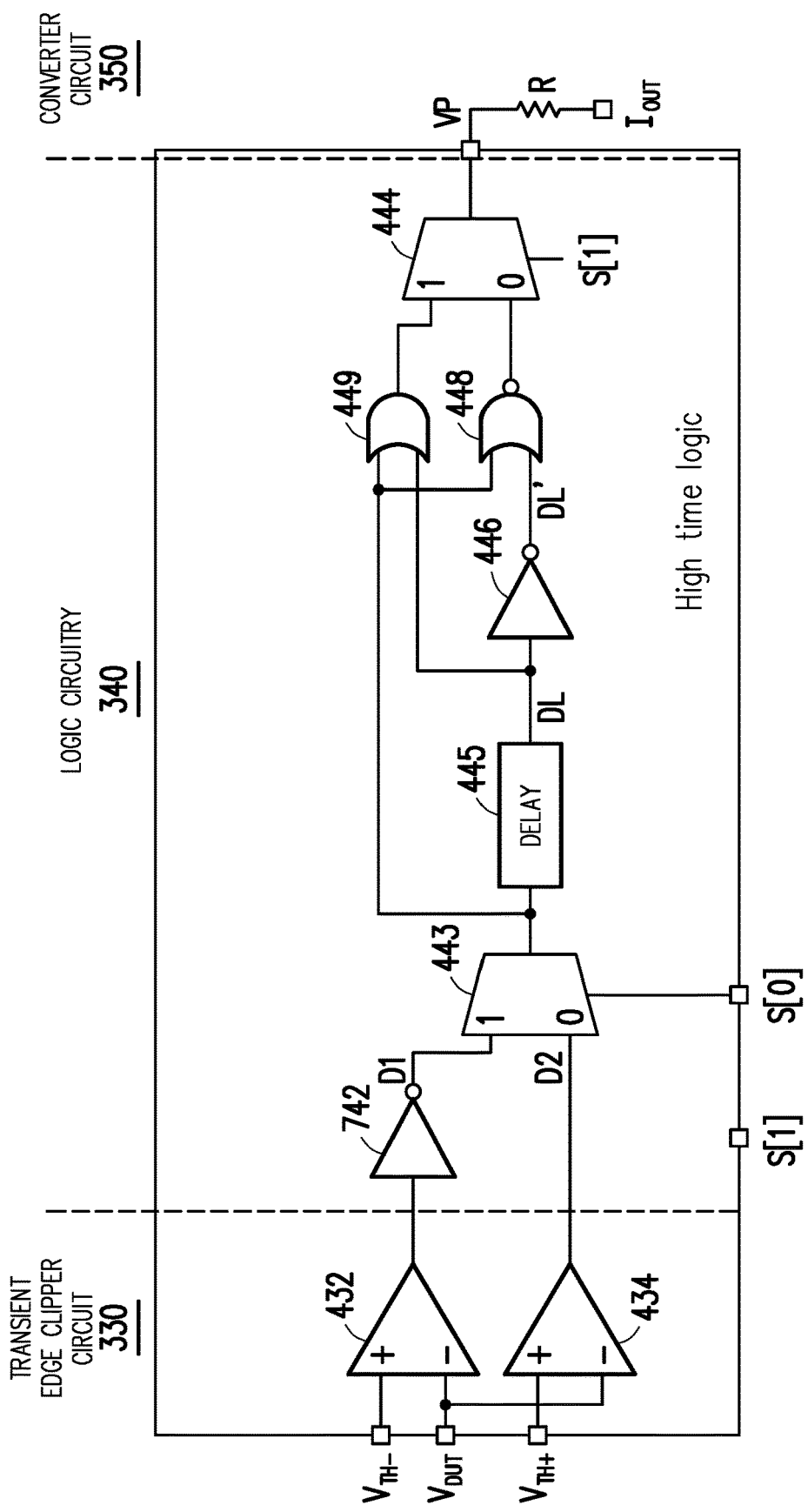
FIG. 7 depicts another example transient edge clipper circuit, logic circuitry, and converter circuit of the monitoring circuit of FIGS. 1 and 3 in accordance with some embodiments.

FIG. 7 depicts another example transient edge clipper circuit, logic circuitry, and converter circuit of the monitoring circuit of FIGS. 1 and 3 in accordance with some embodiments. Transient edge clipper circuit 330 can include operational amplifier 432 and operational amplifier 434. The inverting inputs to operational amplifiers 432, 434 and load capacitor 322 are electrically coupled together. A negative limit of the threshold voltage range, $V_{TH-}$, set by the voltage waveform at voltage point, $V_{DUT}$, is electrically coupled to the non-inverting input of operational amplifier 432. A positive limit of the threshold voltage range, $V_{TH+}$, set by the voltage waveform at voltage point, $V_{DUT}$, is electrically coupled to the non-inverting input of operational amplifier 434. The output voltage waveforms of operational amplifiers 432, 434 are clipped voltage waveforms that electrically coupled to logic circuitry 340.

Logic circuitry 340 includes inverter 742, multiplexer 443, time delay circuit 445, inverter 446, NOR gate 448, OR gate 449, and multiplexer 444. In accordance with some embodiments, the output of operational amplifier 432 is electrically coupled to an inverter 742. Inverter 742 provides an output signal 'D1' to an input of multiplexer 443. The output of operational amplifier 434 provides an output signal 'D2' to an input of multiplexer 443. During high period characterization, the output of operational amplifier 434 'D2' is active. With 'S[0]' select '0', multiplexer 443 outputs D2 to an input of OR gate 449, an input of NOR gate 448, and time delay circuit 445. The output of OR gate 449, $VP_{S10}$, is coupled to an input of multiplexer 444. The output of NOR gate 448, $V_{PS00}$, is coupled to another input of multiplexer 444. During low period characterization, the output of inverter D1 is active. With 'S[0]' select '1', multiplexer 443 outputs D1 to an input of OR gate 449, an input of NOR gate 448, and time delay circuit 445. The output of OR gate 449, $VP_{S11}$, is couple to an input of multiplexer 444. The output of NOR gate 448, $VP_{S01}$, is coupled to another input of multiplexer 444.

Figure 8:
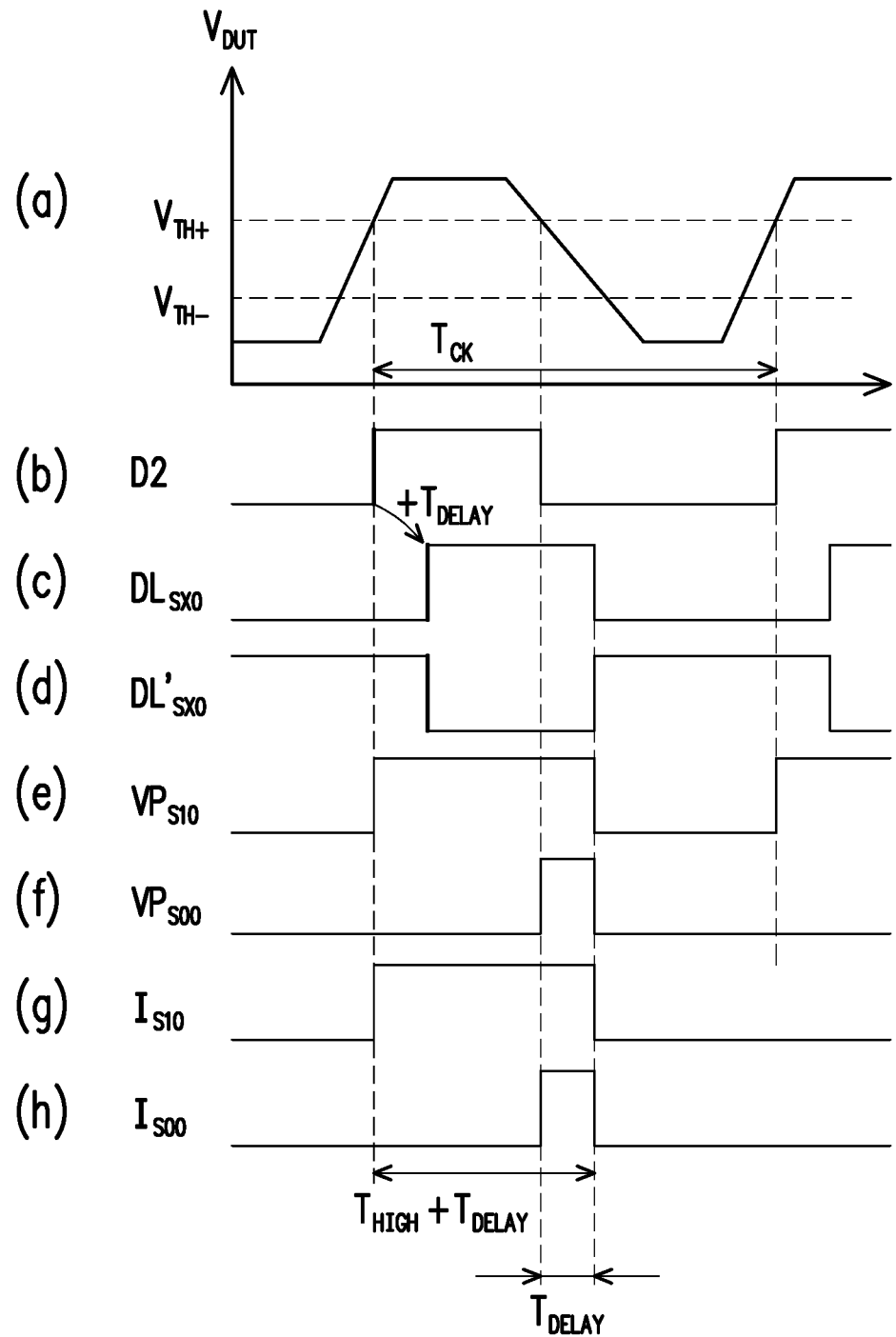
FIG. 8 depicts a series of plots (a)-(h) which illustrate an example detection of a high period of FIGS. 1, 3, and 7 in accordance with some embodiments.

FIG. 8 depicts a series of plots (a)-(h) which illustrate an example detection of a high period of FIGS. 1, 3, and 7 in accordance with some embodiments. Plot (a) of FIG. 8 illustrates a voltage waveform of the DUT 110, $V_{DUT}$, with delineations for the threshold voltage range having a negative voltage threshold, $V_{TH-}$, and a positive voltage threshold, $V_{TH+}$, defined by load capacitor 322. Load capacitor 322 and transient edge clipper circuit 330 clips the voltage waveform of plot (a) to be within the bounds of the predetermined threshold voltage range. Plot (b) of FIG. 8 illustrates a pulse signal representation, 'D2', generated by operational amplifier 434. With the voltage waveform inputs of plot (a), the pulse signal representation 'D2' generated by operational amplifier 434 will be high '1' when the clipped voltage waveform is higher than the positive threshold voltage, $V_{TH+}$, and low when the clipped voltage waveform is any other voltage, as illustrated in plot (b). Plots (c) and (d) of FIG. 8 illustrate the delayed pulse signal representation components of Equation (1) generated by multiplexer 443 after being passed through time delay circuit 445 and inverter 446. The time domain logical representation of plot (c) is as follows:

$$TDL_{SX0} = T_{D2} + T_{DELAY} \quad (13)$$

where $T_{D2}$ is the time domain representation of the pulse signal representation 'D2' of operational amplifier 434, $T_{DELAY}$, is a predetermined time delay introduced by time delay circuit 445, and $TDL_{SX0}$ is the time domain representation of plot (c). The time domain logical representation of plot (d) is as follows:

$$TDL'_{SX0} = \overline{(T_{D2} + T_{DELAY})} \quad (14)$$

where $T_{D2}$ is the time domain representation of the pulse signal representation 'D2' of operational amplifier 434, $T_{DELAY}$, is a predetermined time delay introduced by time delay circuit 445, and $TDL'_{SX0}$ is the time delay representation of plot (d). Plots (e) and (f) of FIG. 8 are voltage pulse representations, VP, of the output of OR gate 449, $VP_{S10}$, and NOR gate 448, $VP_{S00}$, respectively. Plots (g) and (h) of FIG. 8 are current pulse representations of $I_{OUT}$ generated by converter circuit 350. The current pulse representations output by multiplexer 444 can be represented by the following logic expressions:

$$I_{S10} = \frac{(V_{D2} \vee VDL_{SX0})}{R} \quad (15)$$

$$I_{S00} = \frac{\overline{(V_{D2} \vee VDL'_{SX0})}}{R} \quad (16)$$

where $V_{D2}$ is the voltage representation of pulse signal output 'D2' of operational amplifier 434, $VDL_{SX0}$ is the voltage representation of plot (c), $VDL'_{SX0}$ is the voltage representation of plot (d), and R is resistor 452. As illustrated in plot (h) of FIG. 8, a high period, $T_{HIGH}$, of DUT 100 can be determined by the difference between pulse width of the pulse signal representation of plot (g) and the predetermined time delay introduced by time delay circuit 445. In accordance with the embodiments of FIG. 8, the high period of Equation (2) can be represented by the following expression:

$$T_{HIGH} = \frac{(I_{S10} - I_{S00})T_{CK}}{I_{DC}} \quad (17)$$

Figure 9:
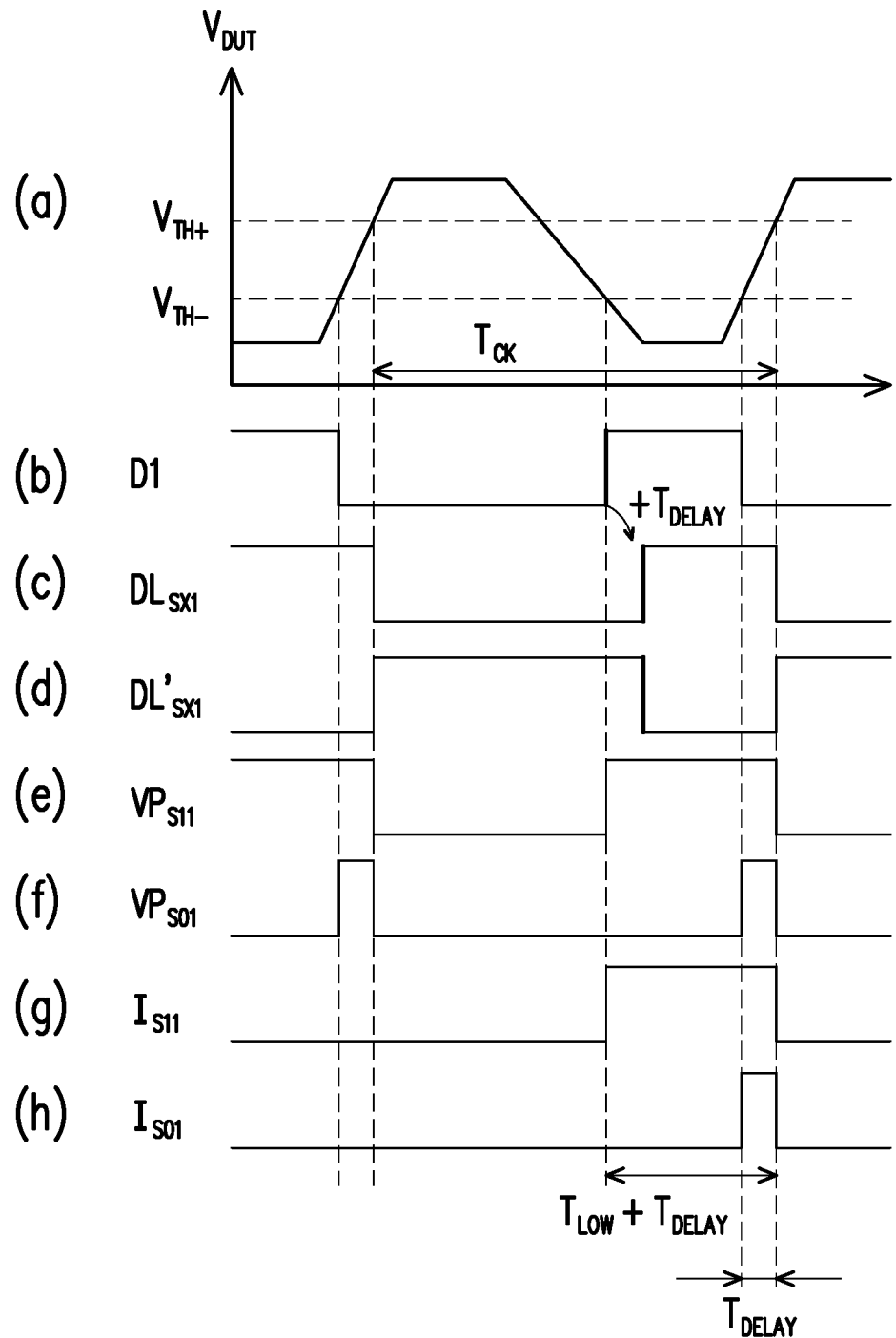
FIG. 9 depicts a series of plots (a)-(h) which illustrate an example detection of a low period of FIGS. 1, 3, and 7 in accordance with some embodiments.

FIG. 9 depicts a series of plots (a)-(h) which illustrate an example detection of a low period of FIGS. 1, 3, and 7 in accordance with some embodiments. Plot (a) of FIG. 9 illustrates a voltage waveform of the DUT 110, $V_{DUT}$, with delineations for the threshold voltage range having a negative voltage threshold, $V_{TH-}$, and a positive voltage threshold, $V_{TH+}$, defined by load capacitor 322. Load capacitor 322 and transient edge clipper circuit 330 clips the voltage waveform of plot (a) to be within the bounds of the predetermined threshold voltage range. Plot (b) of FIG. 9 illustrates a pulse signal representation, 'D1', generated by inverter 742. With the voltage waveform inputs of plot (a), the pulse signal representation 'D1' generated by inverter 742 will be high '1' when the clipped voltage waveform is lower than the negative threshold voltage, $V_{TH-}$, and low when the clipped voltage waveform is any other voltage, as illustrated in plot (b). Plots (c) and (d) of FIG. 9 illustrate the delayed pulse signal representation components of Equation (1) generated by multiplexer 443 after being passed through time delay circuit 445 and inverter 446. The time domain logical representation of plot (c) is as follows:

$$TDL_{SX1} = T_{D1} + T_{DELAY} \quad (18)$$

where $T_{D1}$ is the time domain representation of the pulse signal representation 'D1' of inverter 742, $T_{DELAY}$ is a predetermined time delay introduced by time delay circuit 445, and $TDL_{SX1}$ is the time domain representation of plot (c). The time domain logical representation of plot (d) is as follows:

$$TDL'_{SX1} = \overline{(T_{D1} + T_{DELAY})} \quad (19)$$

where $T_{D1}$ is the time domain representation of the pulse signal representation 'D1' of inverter 742, $T_{DELAY}$ is a predetermined time delay introduced by time delay circuit 445, and $TDL'_{SX1}$ is the time delay representation of plot (d). Plots (e) and (f) of FIG. 9 are voltage pulse representations, VP, of the output of OR gate 449, $VP_{S11}$, and NOR gate 448, $VP_{S01}$, respectively. Plots (g) and (h) of FIG. 9 are current pulse representations of $I_{OUT}$ generated by converter circuit 350. The current pulse representations output by multiplexer 444 can be represented by the following logic expressions:

$$I_{S11} = \frac{(V_{D1} \vee VDL_{SX1})}{R} \quad (20)$$

$$I_{S01} = \frac{\overline{(V_{D1} \vee VDL'_{SX1})}}{R} \quad (21)$$

where $V_{D1}$ is the voltage representation of pulse signal output 'D1' of inverter 742, $VDL_{SX1}$ is the voltage representation of plot (c), $VDL'_{SX1}$ is the voltage representation of plot (d), and R is resistor 452. As illustrated in plot (h) of FIG. 9, a low period, $T_{LOW}$, of DUT 100 can be determined by the difference between pulse width of the pulse signal representation of plot (g) and the predetermined time delay introduced by time delay circuit 445. In accordance with the embodiments of FIG. 9, the low period of Equation (2) can be represented by the following expression:

$$T_{LOW} = \frac{(I_{S11} - I_{S01})T_{CK}}{I_{DC}} \quad (22)$$

Figure 10:
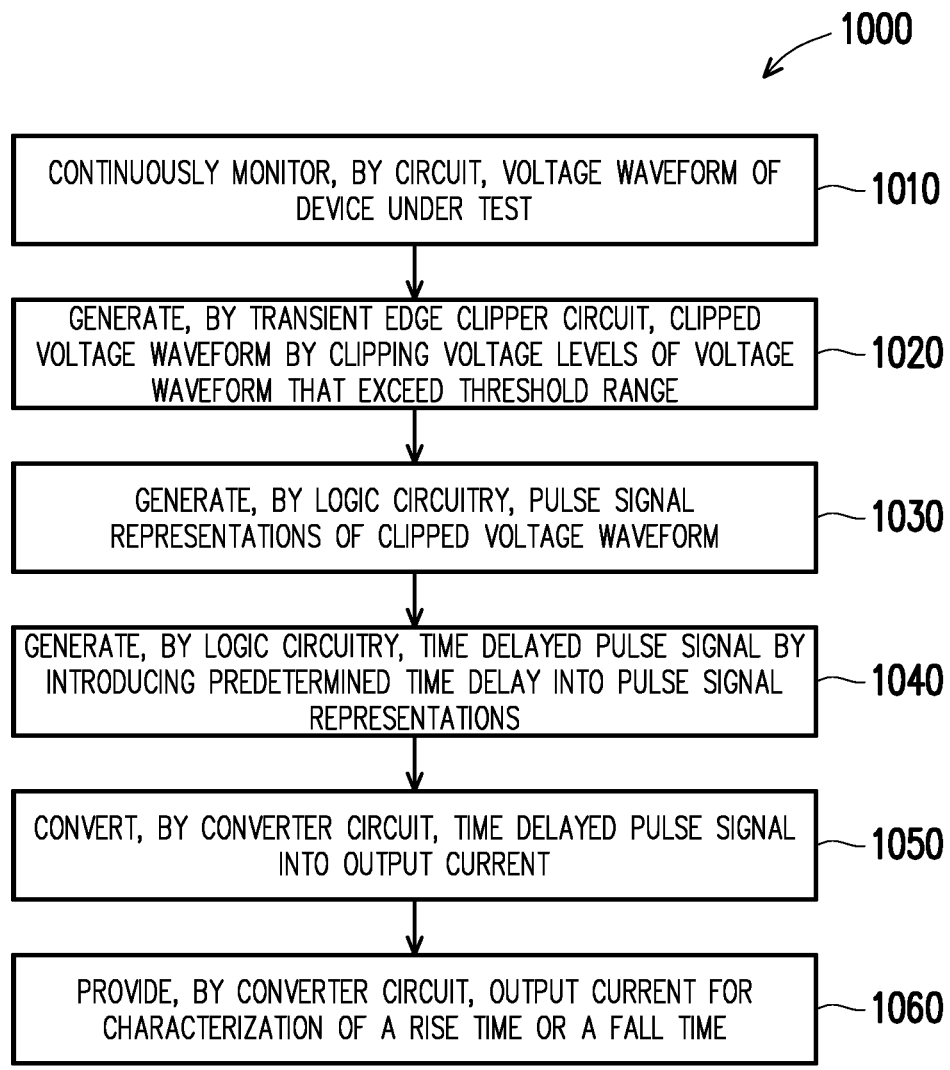
FIG. 10 depicts an example flow chart for monitoring transient times of an analog or digital device under test.

FIG. 10 depicts an example flow chart 1000 for monitoring transient time of an analog or digital device under test. While the process described in FIG. 10 is applicable to many different hardware configurations, the process is described with reference to structures from FIGS. 1, 3-4, and 7 here for ease in understanding. Monitoring circuit 120 continuously monitors a voltage waveform of DUT 110 at 1010. Transient edge clipper circuit 330 generates, at 1020, a clipped voltage waveform by clipping voltage levels of the voltage waveform that exceed a threshold range having a negative voltage threshold, $V_{TH-}$, and a positive voltage threshold, $V_{TH+}$. At 1030, logic circuitry 340 generates pulse signal representations (e.g., plots (b) and (c) of FIGS. 5-6 and plot (b) of FIGS. 8-9) of the clipped voltage waveform. At 1040, logic circuitry 340 generates a time delayed pulse signal, DL, (e.g., plots (d) and (e) of FIGS. 5-6 and plots (c) and (d) of FIGS. 8-9) by introducing a predetermined time delay into the pulse signal representations using time delay circuit 445. Converter circuit 350 converts the time delayed pulse signal into an output current, $I_{OUT}$, at 1050. The output current, $I_{OUT}$, is provided for characterization of a transient time, at 1060, as described in detail in FIGS. 5-6 and 8-9.

Monitoring circuit 120 can continuously monitor for the transient time of one or more voltages of a DUT 110 by being electrically coupled directly to a voltage point of the DUT 110. This electrical connection allows for real-time monitoring of the DUT 110 and circumvents the need for an oscilloscope. By injecting a predetermined time delay into the measured voltage of DUT 110, a transient time can be determined by subtracting out the predetermined time delay from the output current generated by monitoring circuit 120. Monitoring circuit 120 can be applied in a variety of different applications such as electronic devices within automobiles. For example, monitoring circuit 120 can monitor electronic control units (ECUs) or internal components of automobiles. As load capacitor 322 is interchangeable, an appropriate capacitor size can be selected for a specific component of an automobile. If the monitoring circuit 120 detects transient times which exceed a given specification value of a particular component, an automobile can automatically adjust driving code to adjust for such transient times. In another example, monitoring circuit 120 can be used to calibrate transient time resulting from age degradation of a particular component. A transient time can be recorded for a particular component upon installation or at monitoring start time. Monitoring circuit 120 can monitor the transient time of that component throughout its lifetime. Degradation of the component can be determined based on the transient time that do not align with the initially recorded times. Monitoring circuit 120 can identify this to the automobile system and the automobile system can automatically adjust its driving code to compensate accordingly.

The subject matter described herein can provide high accuracy and an adjustable threshold. Additionally, the subject matter described herein can be used with a DC channel printed circuit board design and can be used with a power management unit. Use of this subject matter can have minimal to no bandwidth limitation distortion or minimal to no distortion due to an additional capacitor load. Any test platform costs using the subject matter described herein can be low.

In one embodiment, a circuit includes a transient edge clipper circuit electrically coupled to the device under test. The transient edge clipper circuit is configured to remove voltage levels of a voltage waveform of the device under test which exceed a threshold range to generate a clipped voltage waveform. The circuit also includes logic circuitry electrically coupled to the transient edge clipper circuit. The logic circuitry is configured to generate a time delayed pulse signal representation of the clipped voltage waveform by injecting a predetermined time delay. The circuit also includes a converter circuit electrically coupled to the logic circuitry. The converter circuit is configured to generate a current signal based on the pulse signal representations.

In another embodiment, a method for monitoring the transient time in a device under test includes continuously monitoring, by a monitoring circuit, a voltage waveform of the device under test. A transient edge clipper circuit of the monitoring circuit generates a clipped voltage waveform by clipping voltage levels of the voltage waveform that exceed a threshold range. Logic circuitry of the monitoring circuit generates pulse signal representations of the clipped voltage waveform and a time delayed pulse signal by introducing a predetermined time delay into the pulse signal representations. A converter circuit of the monitoring circuit converts the time delayed pulse signal into an output current and provides the output current for characterization of a transient time.

In yet another embodiment, a system for monitoring the transient time in a device under test includes a device under test and a monitoring circuit. The monitoring circuit includes a transient edge clipper circuit electrically coupled to the device under test. The transient edge clipper circuit is configured to remove voltage levels of a voltage waveform of the device under test which exceed a threshold range to generate a clipped voltage waveform. The circuit also includes logic circuitry electrically coupled to the transient edge clipper circuit. The logic circuitry is configured to generate a time delayed pulse signal representation of the clipped voltage waveform by injecting a predetermined time delay. The circuit also includes a converter circuit electrically coupled to the logic circuitry. The converter circuit is configured to generate a current signal based on the pulse signal representations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

This written description and the following claims may include terms, such as "on," that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on and in immediate contact with the second layer/structure unless such is specifically stated; there may be one or more third layers/structures between the first layer/structure and the second layer/structure. The term "semiconductor device structure" used herein (including in the claims) may refer to shallow trench isolation features, poly-silicon gates, lightly doped drain regions, doped wells, contacts, vias, metal lines, or other types of circuit patterns or features to be formed on a semiconductor substrate.

What is claimed is:

1. A circuit for monitoring a transient time in a device under test, the circuit comprising:
    a transient edge clipper circuit arranged to be electrically coupled to the device under test, the transient edge clipper circuit configured to remove voltage levels of a voltage waveform of the device under test which exceed a threshold range to generate a clipped voltage waveform;
    logic circuitry electrically coupled to the transient edge clipper circuit, the logic circuitry configured to generate a time delayed pulse signal representation of the clipped voltage waveform by injecting a predetermined time delay; and
    a converter circuit electrically coupled to the logic circuitry and configured to generate a current signal based on the pulse signal representations.

2. The circuit of claim 1, wherein the threshold range is determined by a capacitor arranged to be electrically coupled between the device under test and the transient edge clipper circuit, the capacitor is configured to provide threshold signals to the transient edge clipper circuit.

3. The circuit of claim 2, wherein the transient edge clipper circuit comprises a first operational amplifier and a second operational amplifier, each configured to clip the voltage signal by comparing a positive voltage threshold of the threshold range with a negative voltage of the threshold range, wherein the threshold signals comprise the positive voltage threshold and the negative voltage threshold.

4. The circuit of claim 1, wherein the logic circuitry comprises a plurality of multiplexers, a plurality of inverters, a time delay circuit, and at least two logic gates.

5. The circuit of claim 1, wherein the converter circuit comprises a resistor configured to provide the current signal of the device under test.

6. The circuit of claim 1, wherein the transient time is determined based on the current signal and the predetermined time delay.

7. The circuit of claim 1, wherein the circuit is configured to monitor and determine the transient time of the voltage signal in real time.

8. The circuit of claim 1, wherein the circuit is configured to monitor the transient time of the voltage signal with sub-picosecond accuracy.

9. A method for monitoring a transient time in a device under test, the method comprising:

continuously monitoring, by a monitoring circuit, a voltage waveform of the device under test;

generating, by a transient edge clipper circuit of the monitoring circuit, a clipped voltage waveform by clipping voltage levels of the voltage waveform that exceed a threshold range;

generating, by logic circuitry of the monitoring circuit, pulse signal representations of the clipped voltage waveform;

generating, by the logic circuitry, a time delayed pulse signal by introducing a predetermined time delay into the pulse signal representations;

converting, by a converter circuit of the monitoring circuit, the time delayed pulse signal into an output current; and providing, by the converter circuit, the output current for characterization of a transient time.

10. The method of claim 9, wherein the threshold range is determined by a capacitor electrically coupled between the device under test and the transient edge clipper circuit, wherein the method further comprises providing, by the capacitor, threshold signals to the transient edge clipper circuit.

11. The method of claim 10, wherein the transient edge clipper circuit comprises a first operational amplifier and a second operational amplifier, each configured to clip the voltage signal by comparing a positive voltage threshold of the threshold range with a negative voltage of the threshold range, wherein the threshold signals comprise the positive voltage threshold and the negative voltage threshold.

12. The method of claim 9, wherein the logic circuitry comprises a plurality of multiplexers, a plurality of inverters, a time delay circuit, and at least two logic gates.

13. The method of claim 9, wherein the converter circuit comprises a resistor.

14. The method of claim 9, wherein the transient time is determined based on the current signal.

15. The method of claim 9, wherein the monitoring circuit is configured to monitor and determine the transient time of the voltage signal in real time.

16. The method of claim 9, wherein the monitoring circuit is configured to monitor the transient time of the voltage signal with sub-picosecond accuracy.

17. A system for monitoring a transient time in a device under test, the system comprising:

a monitoring circuit comprising:

a transient edge clipper circuit arranged to be electrically coupled to a device under test, the transient edge clipper circuit configured to remove voltage levels of a voltage waveform of the device under test which exceed a threshold range to generate a clipped voltage waveform;

logic circuitry electrically coupled to the transient edge clipper circuit, the logic circuitry configured to generate a time delayed pulse signal representation of the clipped voltage waveform by injecting a predetermined time delay; and a converter circuit electrically coupled to the logic circuitry and configured to generate a current signal based on the pulse signal representations.

18. The system of claim 17, wherein the threshold range is determined by a capacitor arranged to be electrically coupled between the device under test and the transient edge clipper circuit, the capacitor is configured to provide threshold signals to the transient edge clipper circuit.

19. The system of claim 18, wherein the transient edge clipper circuit comprises a first operational amplifier and a second operational amplifier, each configured to clip the voltage signal by comparing a positive voltage threshold of the threshold range with a negative voltage of the threshold range, wherein the threshold signals comprise the positive voltage threshold and the negative voltage threshold.

20. The system of claim 17, wherein the logic circuitry comprises a plurality of multiplexers, a plurality of inverters, a time delay circuit, and at least two logic gates.

\* \* \* \* \*